(12) United States Patent
Kondo et al.

(10) Patent No.: US 8,679,922 B2
(45) Date of Patent: Mar. 25, 2014

(54) METHOD OF PRODUCING SEMICONDUCTOR DEVICE AND METHOD OF PRODUCING SOLID-STATE IMAGE PICKUP DEVICE

(75) Inventors: Takaharu Kondo, Yokohama (JP); Takashi Usui, Ashigarakami-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 62 days.

(21) Appl. No.: 13/360,456

(22) Filed: Jan. 27, 2012

(65) Prior Publication Data

US 2012/0202309 A1    Aug. 9, 2012

(30) Foreign Application Priority Data

Feb. 9, 2011    (JP) .................................. 2011-026348

(51) Int. Cl.
*H01L 21/336*    (2006.01)

(52) U.S. Cl.
USPC .............. 438/270; 438/9; 438/680; 438/700; 438/769; 257/E21.006; 257/E21.027; 257/E21.17; 257/E21.22; 257/E21.217; 257/E21.227; 257/E21.231; 257/E21.267; 257/E21.311; 257/E21.058

(58) Field of Classification Search
USPC ......... 438/270, 700, 736, 738, 602, 603, 604, 438/680, 9, 513, 597, 769; 257/E21.006, 257/E21.027, E21.058, E21.085, E21.17, 257/E21.217, E21.22, E21.227, E21.231, 257/E21.267, E21.311
See application file for complete search history.

(56) References Cited

U.S. PATENT DOCUMENTS

| | | | | |
|---|---|---|---|---|
| 6,977,442 | B2 * | 12/2005 | Akagawa et al. | 257/780 |
| 7,557,029 | B2 * | 7/2009 | Akagawa et al. | 438/612 |
| 8,217,486 | B2 * | 7/2012 | Ishida et al. | 257/499 |
| 8,288,796 | B2 * | 10/2012 | Ito et al. | 257/192 |
| 8,435,857 | B2 * | 5/2013 | Kiyotoshi | 438/261 |
| 2008/0042177 | A1 | 2/2008 | Park | |
| 2008/0135732 | A1 | 6/2008 | Toumiya et al. | |
| 2009/0278967 | A1 | 11/2009 | Toumiya | |

FOREIGN PATENT DOCUMENTS

| | | |
|---|---|---|
| CN | 1501487 A | 6/2004 |
| CN | 101034709 A | 9/2007 |
| CN | 101145560 A | 3/2008 |
| CN | 101924136 A | 12/2010 |
| JP | 2003-324189 A | 11/2003 |
| JP | 2008-047902 A | 2/2008 |
| JP | 2008-166677 A | 7/2008 |
| JP | 2008-235689 A | 10/2008 |
| JP | 2009-272568 A | 11/2009 |

\* cited by examiner

*Primary Examiner* — David Nhu
(74) *Attorney, Agent, or Firm* — Canon USA, Inc. IP Division

(57) ABSTRACT

The method includes a step of forming a mask having an opening, for forming an opening in multiple insulating films, above a semiconductor substrate on which a member becoming a first insulating film, a member becoming a second insulating film being different from the member becoming the first insulating film, a member becoming a third insulating film, and a member becoming a fourth insulating film being different from the member becoming the third insulating film are stacked in this order; a first step of continuously removing the member becoming the fourth insulating film and the member becoming the third insulating film at a portion corresponding to the opening of the mask; and a second step of removing the member becoming the second insulating film, after the first step, at a portion corresponding to the opening of the mask.

8 Claims, 13 Drawing Sheets

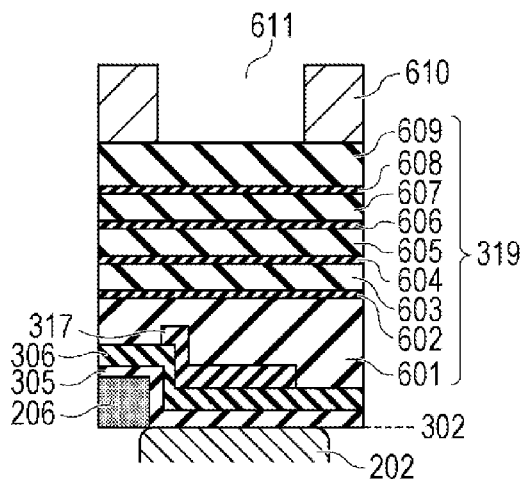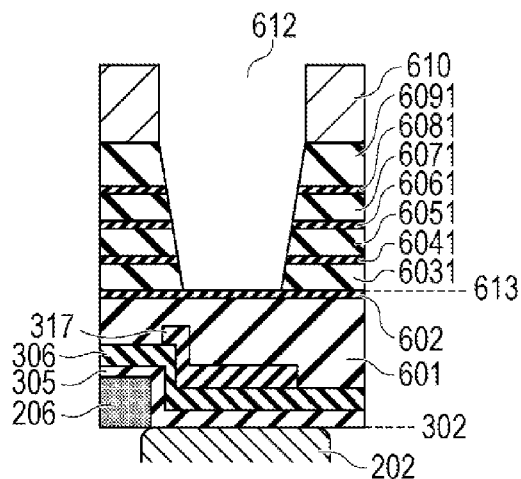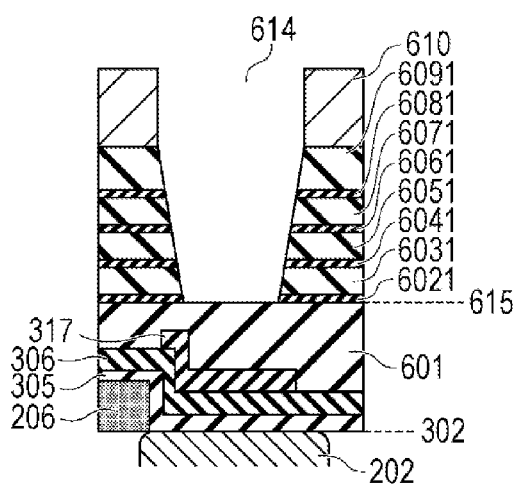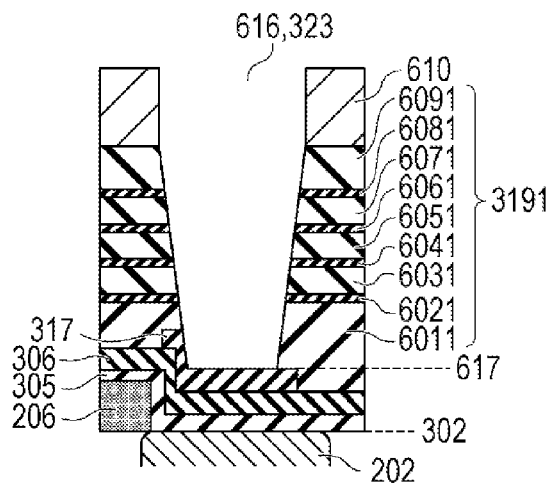

METHOD OF PRODUCING SEMICONDUCTOR DEVICE AND METHOD OF PRODUCING SOLID-STATE IMAGE PICKUP DEVICE

BACKGROUND OF THE INVENTION

1. Field of the Invention

The present invention relates to a method of producing a semiconductor device and a method of solid-state image pickup device.

2. Description of the Related Art

In recent years, solid-state pickup devices having waveguides have been proposed in order to increase the amount of light that enters photoelectric conversion units.

Japanese Patent Laid-Open No. 2003-324189 discloses a configuration of a solid-state pickup device having two types of insulating films alternately arranged on a photoelectric conversion unit to provide a waveguide structure. The waveguide is formed by forming an opening by removing the two types of the insulating films at a portion corresponding to a photo detector and filling the opening with a passivation film of a material having a higher refractive index than the insulating films.

SUMMARY OF THE INVENTION

The present invention provides a semiconductor device-producing method in which an opening can be precisely formed.

The method of producing a semiconductor device according to the present invention is a method of producing a semiconductor device having a semiconductor substrate and multiple insulating films including a first insulating film disposed on the semiconductor substrate, a second insulating film disposed on the first insulating film, a third insulating film disposed on the second insulating film, and a fourth insulating film disposed on the third insulating film and having an opening communicating among at least the second insulating film, the third insulating film, and the fourth insulating film. The method includes a step of forming a mask having an opening, for forming an opening in the multiple insulating films, above the semiconductor substrate on which a member to be formed into the first insulating film, a member to be formed into the second insulating film made of a material different from that of the member to be formed into the first insulating film, a member to be formed into the third insulating film, and a member to be formed into the fourth insulating film made of a material different from that of the member to be formed into the third insulating film are stacked in this order; a first step of continuously removing the member to be formed into the fourth insulating film at a portion corresponding to the opening of the mask and the member to be formed into the third insulating film at a portion corresponding to the opening of the mask by etching the member to be formed into the fourth insulating film and the member to be formed into the third insulating film using the mask under conditions that both the member to be formed into the fourth insulating film and the member to be formed into the third insulating film are etched; and a second step of removing the member to be formed into the second insulating film at a portion corresponding to the opening of the mask after the first step by etching the member to be formed into the second insulating film using the mask under conditions that the etching rate of the member to be formed into the second insulating film is higher than that of the member to be formed into the first insulating film.

The present invention provides a method of producing a solid-state pickup device that has a semiconductor substrate provided with a plurality of photoelectric conversion units; multiple insulating films including a first insulating film disposed on the semiconductor substrate, a second insulating film disposed on the first insulating film, a third insulating film disposed on the second insulating film, and a fourth insulating film disposed on the third insulating film and having openings each communicating among at least the second insulating film, the third insulating film, and the fourth insulating film; and a high refractive index member disposed in each of the openings and an insulating film disposed between the high refractive index member and the photoelectric conversion units so as to correspond to the plurality of photoelectric conversion units. The method includes a step of forming a mask having openings, for forming openings in the multiple insulating films, above the semiconductor substrate on which a member to be formed into the insulating film disposed between the high refractive index member and the photoelectric conversion units, a member to be formed into the first insulating film, a member to be formed into the second insulating film made of a material different from that of the member to be formed into the first insulating film, a member to be formed into the third insulating film, and a member to be formed into the fourth insulating film made of a material different from that of the member to be formed into the third insulating film are stacked in this order; a first step of removing the member to be formed into the fourth insulating film at portions corresponding to the openings of the mask and the member to be formed into the third insulating film at portions corresponding to the openings of the mask by etching the member to be formed into the fourth insulating film and the member to be formed into the third insulating film using the mask under conditions that both the member to be formed into the fourth insulating film and the member to be formed into the third insulating film are etched; a second step of removing the member to be formed into the second insulating film at portions corresponding to the openings of the mask after the first step by etching the member to be formed into the second insulating film using the mask under conditions that the etching rate of the member to be formed into the second insulating film is higher than that of the member to be formed into the first insulating film; and a third step of removing the member to be formed into the first insulating film at portions corresponding to the openings of the mask by etching the member to be formed into the first insulating film using the mask under conditions that the etching rate of the member to be formed into the first insulating film is higher than that of the member to be formed into the insulating film disposed between the high refractive index member and the photoelectric conversion units.

Further features of the present invention will become apparent from the following description of exemplary embodiments with reference to the attached drawings.

BRIEF DESCRIPTION OF THE DRAWINGS

FIGS. 6A to 6D are diagrams showing details of the method of producing the solid-state pickup device of Example 1.

DESCRIPTION OF THE EMBODIMENTS

Figure 1:
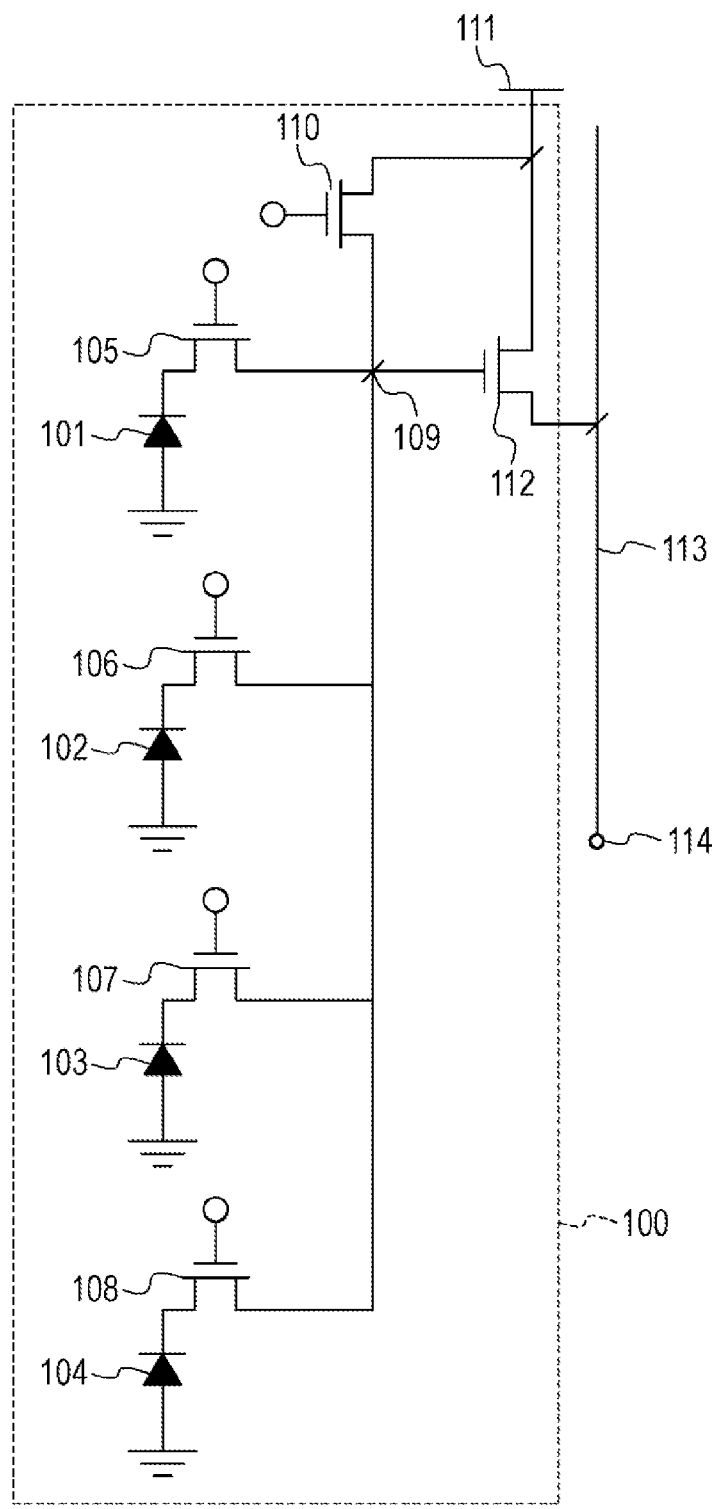
FIG. 1 is a circuit diagram of a pixel cell of solid-state pickup devices of Example 1.

The present inventors have found that in the case in which a region where two or more types of insulating films are alternately stacked are removed by etching, the side wall of the resulting opening tends to have irregularities, and etching for forming a plurality of openings in a wafer causes variation in etching amount. Variation in shape of the openings due to the irregularities on side walls of the openings or the variation of the etching amount leads variation of light intensity or color shading in chips or pixels for collecting light as waveguides. A semiconductor device-producing method in which an opening can be precisely formed will be described with reference to the drawings.

The present invention relates to a method of producing a semiconductor device having a semiconductor substrate and multiple insulating films on the semiconductor substrate. The multiple insulating films include a first insulating film disposed on the semiconductor substrate, a second insulating film disposed on the first insulating film, a third insulating film disposed on the second insulating film, and a fourth insulating film disposed on the third insulating film. Furthermore, the multiple insulating films have an opening communicating among at least the second insulating film, the third insulating film, and the fourth insulating film. The method of producing the semiconductor device includes a step of forming a mask, a first step, and a second step. In the step of forming a mask, a member to be formed into the first insulating film, a member to be formed into the second insulating film made of a material different from that of the member to be formed into the first insulating film, a member to be formed into the third insulating film made of a material different from that of the member to be formed into the second insulating film, and a member to be formed into the fourth insulating film made of a material different from that of the member to be formed into the third insulating film are stacked on the semiconductor substrate; and a mask having an opening for forming openings in the multiple insulating films is formed above the semiconductor substrate provided with the insulating films. In the first step, the member to be formed into the fourth insulating film and the member to be formed into the third insulating film are etched using the mask under conditions that both the member to be formed into the fourth insulating film and the member to be formed into the third insulating film are etched. In the first step, the member to be formed into the fourth insulating film and the member to be formed into the third insulating film are continuously removed at a portion corresponding to the opening of the mask. In the second step, after the first step, the member to be formed into the second insulating film is etched using the mask under conditions that the etching rate of the member to be formed into the second insulating film is higher than that of the member to be formed into the first insulating film. In the second step, the member to be formed into the second insulating film is removed at a portion corresponding to the opening of the mask.

According to such a method, an opening (aperture or depression) can be precisely formed. In particular, in the case of forming openings having a large aspect ratio, it is possible to inhibit variation caused by that a film that should be removed remains in any of the openings in a wafer or caused by that a film that should not be removed is removed. In the second step, the first insulating film can absorb damage due to etching for absorbing variation, resulting in a reduction in noise in the resulting semiconductor device or solid-state pickup device.

Hereinafter, the term "opening" refers to both a case where the opening passes through interlayer insulating films and a case (of depression) where the opening does not pass through the films and is also called a hole. In the following examples, as configurations having openings, configurations having waveguides are described, but the opening is applicable to any configuration such as a through-hole electrode. The present invention can be applied to general semiconductor devices, but in the following examples, the present invention is described in examples of application to solid-state pickup devices. Incidentally, the etching selection ratio is a ratio of an etching rate of a first member to an etching rate of a second member. A higher ratio indicates that only the first member is etched, and a lower ratio indicates that the second member is etched together. The refractive index of silicon oxide is about 1.4 to 1.5, the refractive index of silicon nitride is about 1.8 to 2.3, and the refractive index of silicon oxynitride is a level therebetween. In the method of producing the configuration, detailed descriptions of processes that can be performed by known methods of producing a semiconductor are omitted in the following descriptions. The method will be described in detail with reference to the drawings.

Example 1

In Example 1, a method of producing a solid-state pickup device as an example of the semiconductor device will be described. The method of producing the solid-state pickup device is described with reference to FIGS. 1, 2, 3A to 3C, 4A to 4C, 5A, 5B, and 12. First, the solid-state pickup device of Example 1 will be described with reference to FIGS. 1, 2, and 12.

FIG. 1 is a circuit diagram of a pixel cell of solid-state pickup devices of Example 1. The pixel cell 100 shown in FIG. 1 includes four photodiodes (hereinafter referred to as PDs) 101 to 104, four transfer transistors 105 to 108, one reset transistor 110, and one amplifier transistor 112. The pixel cell 100 also includes floating diffusion node (hereinafter referred to as FD node) 109. Here, a case where the signal charge is electrons and the transistor is N-type will be described.

The anodes of the four PDs 101 to 104 are connected to the ground. The PDs 101 to 104 photoelectrically convert incident light into charge associated with the amount of the light and store the charge. The four transfer transistors 105 to 108 transfer the signal charge generated by the corresponding PDs 101 to 104 to the FD node 109. Specifically, the first PD 101 is connected to the source of the first transfer transistor 105, the second PD 102 is connected to the source of the second transfer transistor 106, the third PD 103 is connected to the source of the third transfer transistor 107, and the fourth PD 104 is connected to the source of the fourth transfer transistor 108. The drains of the first to fourth transfer transistors 105 to 108 are united to configure the FD node 109. The amplifier transistor 112 is connected to the FD node 109 through its gate electrode, is connected to a power supply line 111 through its drain, and is connected to an output signal line 113 through its source, so that a signal based on the potential of the FD node 109 is output to the output signal line 113. The reset transistor 110 is connected to the FD node 109 to reset the potential of the FD node 109 to an arbitrary potential. Alternatively, the PDs 101 to 104 can also be reset by conducting the transfer transistor 105 to 108. The power supply line 111 has at least two potentials, and a signal can be output to the output signal line 113 by setting the FD node 109 to two potential levels. A terminal 114 is connected to a readout circuit, which is described below.

If a repeating unit including at least one photoelectric conversion unit is defined as a pixel, the pixel cell 100 in FIG. 1 includes four pixels. The configuration of the pixel cell 100 is not limited to the case of four PDs and may include a selection transistor, a capacitor, or other components. The photoelectric conversion unit is not limited to the photodiode exemplified here and may be, for example, a photogate.

Figure 12:
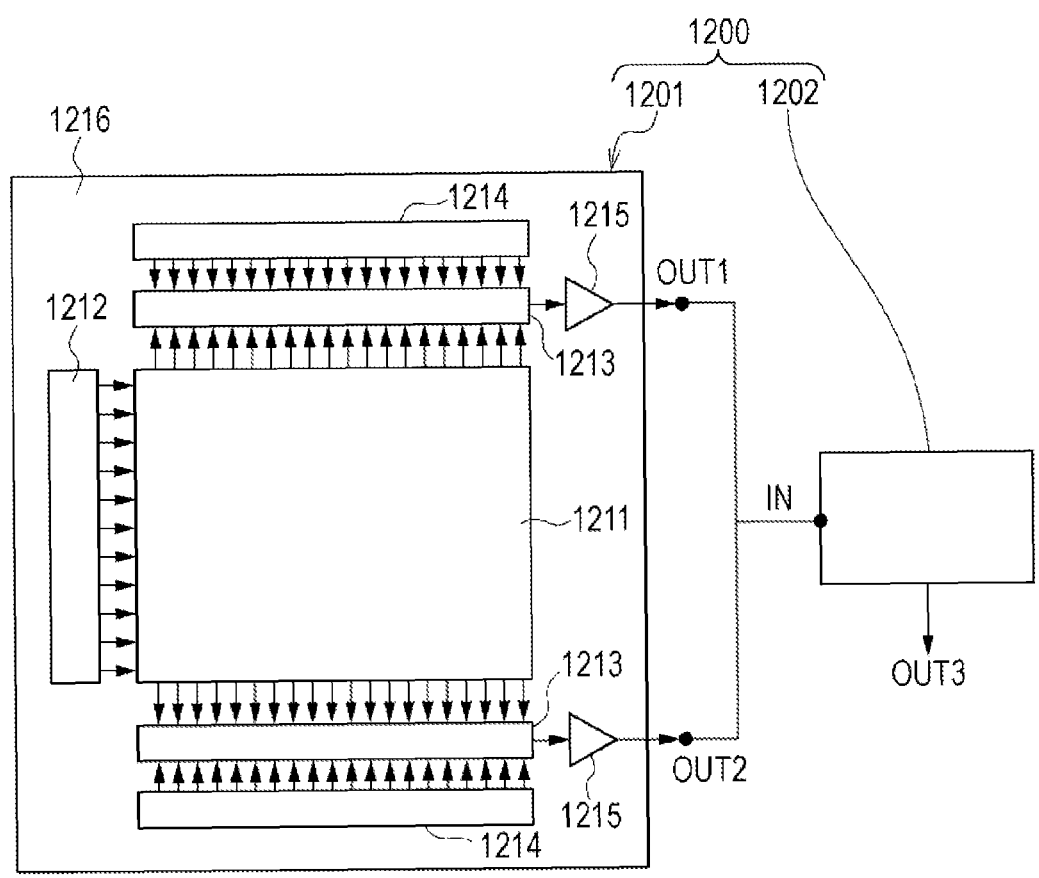
FIG. 12 is a block diagram illustrating a solid-state pickup device and an image pickup system.

FIG. 12 is a diagram schematically illustrating the configurations of a solid-state pickup device and an image pickup system. In FIG. 12, the solid-state pickup device 1201 includes a pixel portion 1211, a vertical scanning circuit 1212, two readout circuits 1213, two horizontal scanning circuits 1214, and two output amplifiers 1215. The regions other than the pixel portion 1211 are collectively called a peripheral circuit portion 1216.

In FIG. 12, the pixel portion 1211 is configured of two-dimensionally arranged pixel cells shown in FIG. 1. That is, a plurality of pixels are disposed in the pixel portion 1211. Each pixel cell is configured of a plurality of pixels. The readout circuit 1213 includes column amplifiers, CDS circuits, adder circuits, and other components and performs, for example, amplification or addition of signals read out from the pixels of a line selected by the vertical scanning circuit 1212 through the vertical signal line. The column amplifier, the CDS circuit, the adder circuit, and other components are provided for each pixel array or for a plurality of pixel arrays. The horizontal scanning circuit 1214 generates signals for sequentially reading out signals of the readout circuit 1213. The output amplifier 1215 amplifies the signal of an array selected by the horizontal scanning circuit 1214 and outputs it. The configuration described above is merely an example of the configuration of the solid-state pickup device, and the embodiment is not limited thereto. For example, though the readout circuits 1213, the horizontal scanning circuits 1214, and the output amplifiers 1215 are disposed on both sides of the pixel portion 1211 to configure two output paths, three or more output paths may be provided.

Figure 2:
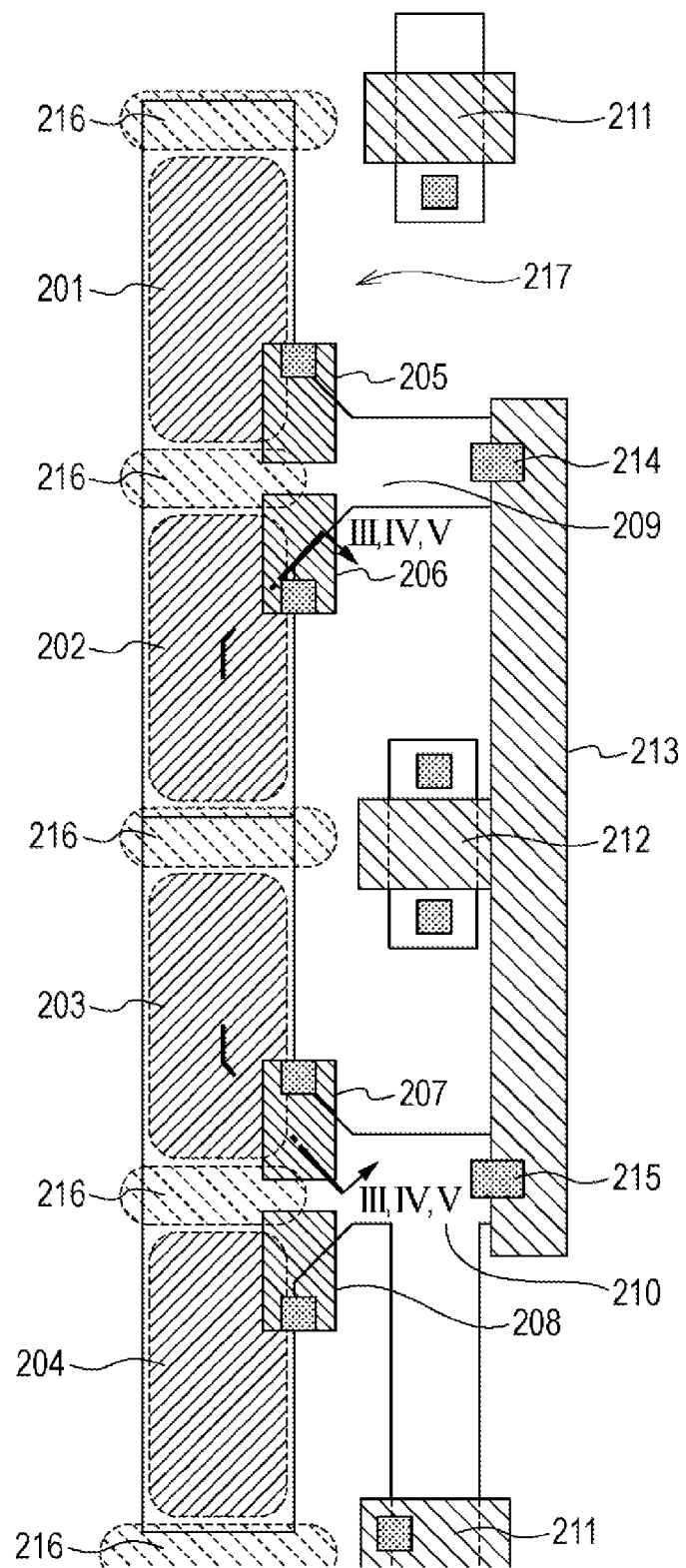
FIG. 2 is a diagram showing a planar layout of the pixel cell of the solid-state pickup devices of Example 1.

Next, a planar layout corresponding to FIG. 1 is described with reference to FIG. 2. In FIG. 2, the first to fourth PDs 201 to 204 are arranged. Here, a part of each PD, i.e., the portion of the charge accumulation region (N-type semiconductor region) is shown for simplifying. Gate electrodes 205 to 208 of the first to fourth transfer transistors are disposed so as to correspond to the first to fourth PDs 201 to 204, respectively. A first floating diffusion region 209 (hereinafter referred to as first FD region) is a common region for the drain of the first transfer transistor and the drain of the second transfer transistor. A second floating diffusion region 210 (hereinafter referred to as second FD region) is a common region for the drain of the third transfer transistor and the drain of the fourth transfer transistor. The first FD region 209, the second FD region 210, and the gate electrode 212 of the amplifier transistor are connected with a connecting wire 213. The gate electrode 212 of the amplifier transistor and the connecting wire 213 are unified. The first FD region 209 and the connecting wire 213 are connected with a shared contact 214, and the second FD region 210 and the connecting wire 213 are connected with a shared contact 215. The shared contact is a contact that connects between semiconductor regions, between a semiconductor region and a gate electrode, or between gate electrodes without intervening of a wiring layer. In FIG. 2, the second FD region 210 is a common region with the source or drain of the reset transistor. The reference numeral 211 denotes the gate electrode of the reset transistor.

Here, in FIG. 2, the PDs and the regions serving as sources/drains of the transistors and the channels are active regions, and the region other than the active regions is an element isolation region 217. Potential barriers 216 against signal charge are disposed as semiconductor regions between the PDs as the active regions and between the gate electrodes of the transfer transistors. The potential barriers 216 function as element isolation regions that inhibit intercommunication of the signal charge between adjacent PDs.

A method of producing such a solid-state pickup device is described with reference to FIGS. 3A to 3C, 4A to 4C, 5A, and 5B, which are cross-sectional views illustrating the process of the method and taken along line III/IV/V-III/IV/V of FIG. 2. Specifically, FIGS. 3A to 3C, 4A to 4C, 5A, and 5B show cross-sectional views of the second and third PDs of the pixel cell taken along the line III/IV/V-III/IV/V of FIG. 2, a transistor 303 of the pixel cell, and a transistor 304 of the peripheral circuit portion. The same configurations as those in the above descriptions are designated with the same reference numerals, and descriptions thereof are omitted. Detailed descriptions of configurations that can be formed by a general semiconductor technology are also omitted.

Figure 3A:
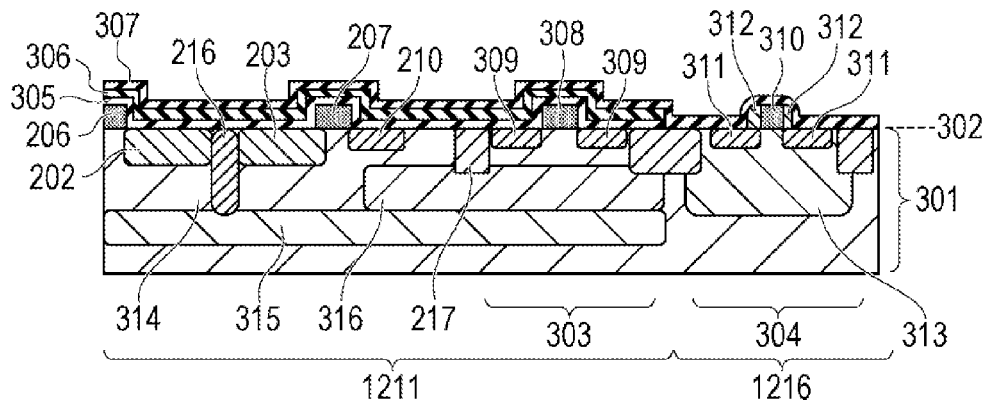
FIGS. 3A to 3C are diagrams showing a method of producing the solid-state pickup devices of Example 1.

A step of preparing a semiconductor substrate provided with elements will now be described with reference to FIG. 3A. The semiconductor substrate 301 is made of silicon and has a main surface 302. The semiconductor substrate 301 is provided with charge accumulation regions 202 and 203 of two PDS, a transistor 303 of the pixel cell, and a transistor 304 of the peripheral circuit portion. In FIG. 3A, the transistor 303 of the pixel portion includes an N-type source/drain region 309 and a gate electrode 308, and an N-type semiconductor region 314 is disposed under the charge accumulation regions 202 and 203. The N-type semiconductor region 314 has an impurity concentration lower than that in the charge accumulation regions and configures, together with the charge accumulation regions, a part of a photoelectric conversion unit. A P-type semiconductor region 315 functioning as a part of the photoelectric conversion unit is disposed under the N-type semiconductor region 314, and a P-type semiconductor region 316 is disposed under the source/drain region 309 of the transistor 303 and the second FD region 210. The transistor 304 of the peripheral circuit portion includes a CMOS circuit, but in this embodiment, only an N-type transistor is shown. The transistor 304 of the peripheral circuit portion includes an N-type source/drain region 311 disposed in the P-type semiconductor region 313 and a gate electrode 310 disposed on the main surface 302 of the semiconductor substrate between the source and the drain regions. Thus, the semiconductor substrate 301 having such elements is prepared.

FIG. 3A shows a step of forming an insulating film on the elements. In the pixel portion 1211, an insulating film (not shown) made of silicon oxide, an insulating film 305 made of silicon nitride, and an insulating film 306 made of silicon oxide are stacked in this order from the main surface 302 side. These films can be formed by chemical vapor deposition (CVD).

In the transistor 304, a side spacer 312 is disposed on the side wall of the gate electrode 10, and the source/drain region 311 has an LDD structure (not shown). The side spacer 312 is a laminate of films of silicon oxide, silicon nitride, and silicon oxide. These films can be formed by plasma CVD. The films forming the side spacer 312 may be formed by the same films as the insulating film (not shown) formed in the pixel portion 1211, the insulating film 305, and the insulating film 306.

In FIG. 3A, an insulating film 307 of silicon nitride is deposited over the pixel portion 1211 and the peripheral circuit portion 1216 by, for example, low-pressure plasma CVD (LP-CVD). Here, before formation of the insulating film 307, a silicon oxide film (not shown) may be deposited over the pixel portion 1211 and the peripheral circuit portion 1216 by plasma CVD for not exposing the main surface 302 of the semiconductor substrate in the source/drain region 311 of the transistor 304 of the peripheral circuit portion.

Figure 3B:
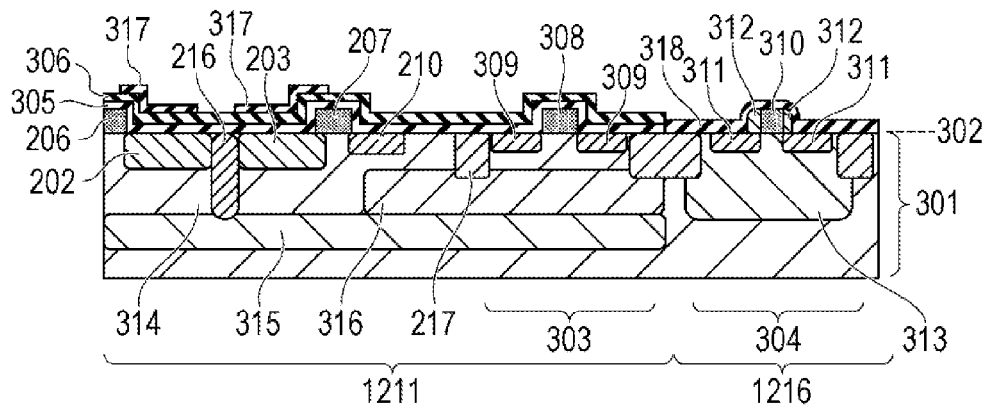

As shown in FIG. 3B, the insulating film 307 formed over the pixel portion 1211 and the peripheral circuit portion 1216 is patterned into a desired shape by known lithography and etching technologies to form insulating films 317 and 318. Here, the insulating film 317 is disposed so as to extend from above the charge accumulation region 202 or 203, i.e., the photoelectric conversion unit to above a part of the gate electrode of the transfer transistor. One insulating film 317 is disposed so as to correspond to one photoelectric conversion unit. The insulating film 307 shown in FIG. 3A is removed by etching in the region of the pixel portion 1211 other than the regions for the insulating films 317. In the peripheral circuit portion 1216, the insulating film 307 shown in FIG. 3A is not etched and serves as the insulating film 318.

Figure 3C:
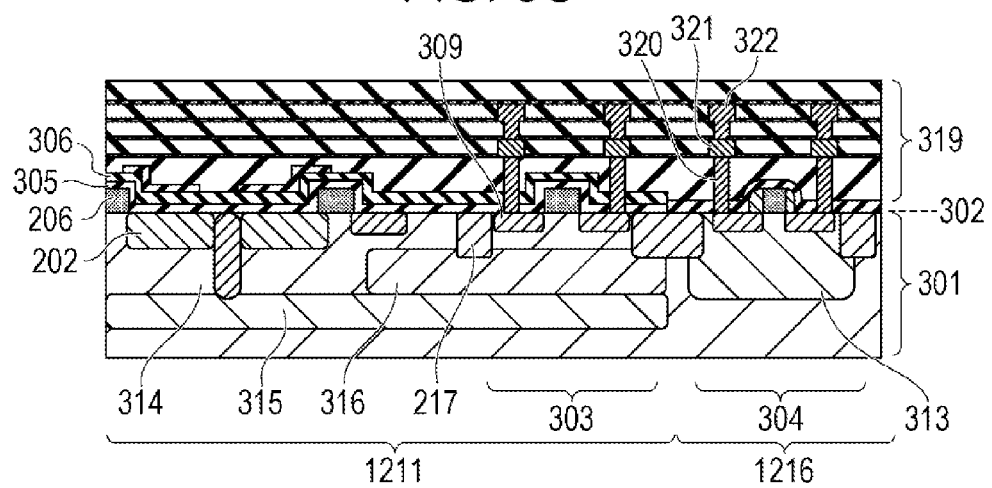

Subsequently, as shown in FIG. 3C, interlayer insulating films 319, a plurality of contacts 320, a first wiring layer 321 including a plurality of wirings, and a second wiring layer 322 having a via and a plurality of wirings are formed on the configuration shown in FIG. 3B. In the interlayer insulating films 319, insulating films (members) made of silicon oxide and insulating films (members) made of silicon nitride are alternately stacked. The insulating films made of silicon oxide are formed by plasma CVD so as to each have a thickness of about 120 to 1000 nm. The insulating films made of silicon nitride are formed by plasma CVD so as to each have a thickness of about 10 to 200 nm. Consequently, the interlayer insulating films 319 are mostly made of silicon oxide. The insulating films made of silicon nitride function as etching stop films in forming a wiring layer or a via or function as barrier films against metals configuring the wiring layers. The interlayer insulating films 319 function later as clad of a wave guide.

The main component of the contact 320 is tungsten, and the main components of the first wiring layer 321 and the second wiring layer 322, which is integrally formed with the via, are copper. The first wiring layer 321 has a structure formed by a single damascene process, and the second wiring layer 322 has a structure formed by a dual damascene process as an electric conductor in which the via and the wiring layer are united. The contact, the via, and the wiring layers each contain a barrier metal. The first and the second wiring layers are made of a metal of which main component is copper. These components can be formed by known methods, and descriptions of the methods are omitted. The first and the second wiring layers may be formed by patterning instead of the damascene processes.

Here, in FIG. 3C, in the multiple insulating films made of silicon oxide, the insulating films disposed so as to be in contact with the upper surface of the first or the second wiring layer function as barrier films against the metal, that is, copper. The insulating films disposed on the bottom side of the first or the second wiring layer function as etching stop films when the first and the second wiring layers are formed by the damascene process. The insulating films functioning as etching stop films have smaller thicknesses than the insulating films functioning as barrier films. The damascene process includes a step of forming a groove for a wiring or a groove for a wiring and a via in an insulating film. In the etching for forming this groove, an etching stop film is effective for controlling the shape of the groove. According, insulating films serving as etching stop films are disposed on the bottom sides of the first and the second wiring layers. The disposed etching stop films are removed when the grooves are formed and are therefore disposed such that the lower surface of the etching stop film is correspondent with the lower surface of the first or the second wiring layer or lies above the lower surface of the first or the second wiring layer. Alternatively, a wafer provided with the configuration described in FIGS. 3A to 3C may be obtained and the following step of forming openings may be conducted.

Subsequently, openings 323 are formed in the interlayer insulating films 319 shown in FIG. 3C to form interlayer insulating films 3191 shown in FIG. 4A. A photoresist pattern (not shown) having openings at positions corresponding to photoelectric conversion units is formed on the interlayer insulating films 319, and etching is conducted using the pattern as a mask. The etching is performed by anisotropic etching such as plasma etching until that the insulating film 317 is exposed. Here, the insulating film 317 reduces plasma damage to the photoelectric conversion unit during the etching and also functions as an etching stop film. Furthermore, the insulating film 317 functions as an antireflective film for light that should enter the semiconductor substrate, together with the insulating film (not shown) of silicon oxide, the insulating film 305, and the insulating film 306 disposed between the insulating film 317 and the main surface 302 of the semiconductor substrate.

Figure 4A:
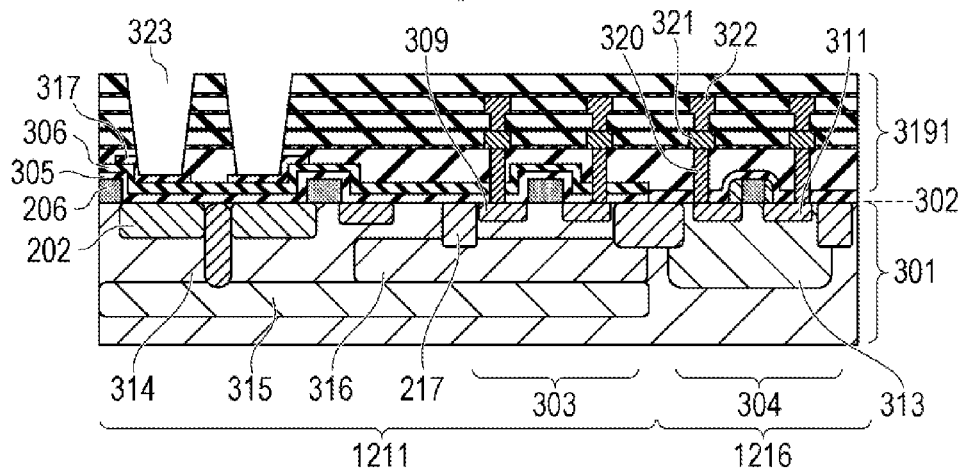
FIGS. 4A to 4C are diagrams showing the method of producing the solid-state pickup devices of Example 1.

Subsequently, the openings 323 shown in FIG. 4A are filled with a transparent material having a higher refractive index than the interlayer insulating films 3191 serving as clad to form a core of the waveguide. Here, the opening 323 is filled with silicon nitride having a higher refractive index than silicon oxide, which is the main material configuring the interlayer insulating films 3191. Specifically, silicon nitride is deposited to fill the entire opening 323 by high-density plasma CVD. For example, the silicon nitride deposited on unnecessary positions, for example, on the interlayer insulating films 3191 at positions other than the opening 323, is removed by chemical mechanical polishing (CMP) or plasma etching. The surface of the silicon nitride is planarized to form a high refractive index member 324 in the opening 323. The waveguide is configured of the interlayer insulating films 3191 and the high refractive index member 324. Here, in this embodiment, removal of unnecessary silicon nitride and planarization of the surface are performed by CMP. On this occasion, in order to inhibit damage to the wiring layer, the silicon nitride on the interlayer insulating films 3191 is not thoroughly removed, and an insulating film 325 having a thickness of about 100 to 500 nm is formed with the silicon nitride on the upper surfaces of the high refractive index members 324 and the interlayer insulating films 3191. Furthermore, an insulating film 326 of silicon oxynitride is formed on the insulating film 325. The insulating film 326 is formed by plasma CVD so as to have a thickness of about 50 to 150 nm.

Figure 4B:
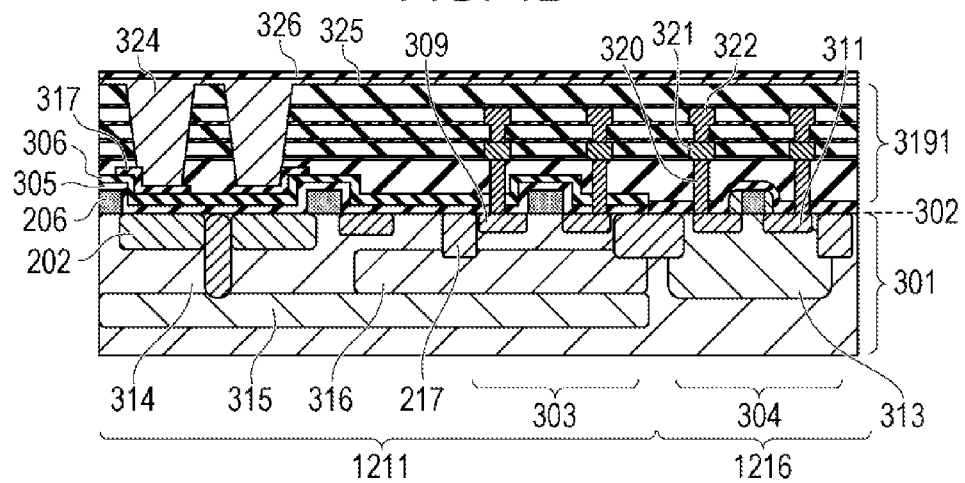

After formation of the configuration shown in FIG. 4B, at least part of an arbitrary region of the insulating films 325 and 326 is removed. Specifically, in this embodiment, the insulating films 325 and 326 of the peripheral circuit portion 1216 are removed by etching at least at a region where a via is formed later. The removal is performed by, for example, plasma etching. As a result, the insulating films 325 and 326 are respectively formed into insulating films 327 and 328 having an opening 329. Then, an insulating film serving as an insulating film 330 is formed so as to fill the opening 329 and cover the insulating film 327 and the insulating film 328. The insulating film serving as the insulating film 330 is formed of, for example, silicon oxide by plasma CVD. Subsequently, a via 331 is formed so as to pass through the insulating film serving as the insulating film 330 and a part of the interlayer insulating films 319 arranged above the second wiring layer 322. When the via 331 is formed, the insulating film 330 and interlayer insulating films 332 are formed. The via 331 is made of, for example, tungsten and contains a barrier metal such as titanium or titanium nitride. A third wiring layer 333 is formed on the via 331 to obtain a configuration shown in FIG. 4C. The third wiring layer 333 is made of an electric conductor of which main component is, for example, aluminum and is formed by patterning. Here, the third wiring layer 333 can also function as a light-shielding film.

Figure 4C:
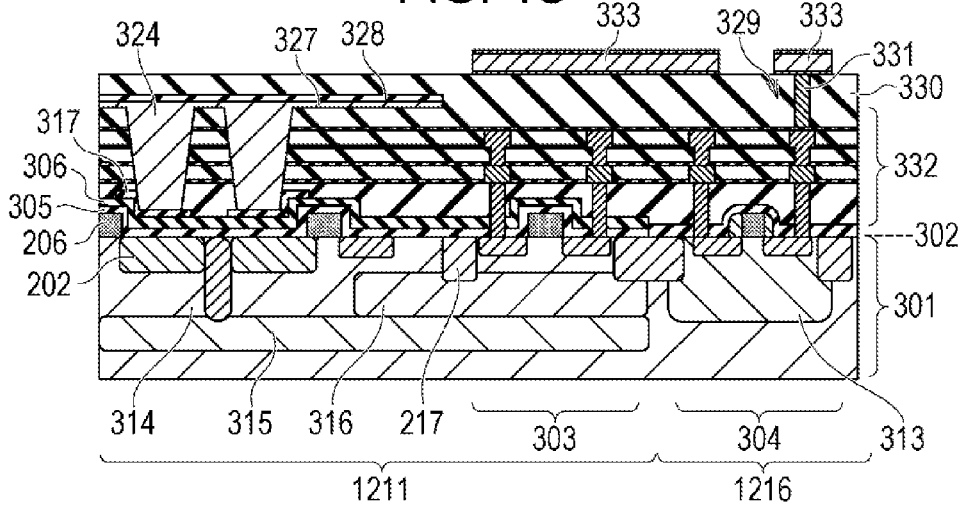
Figure 5A:
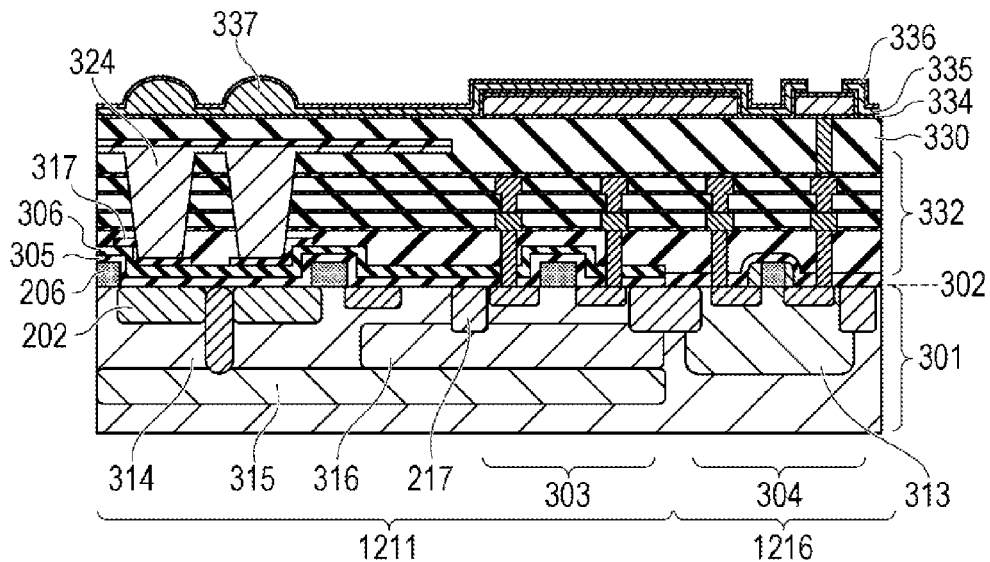
FIGS. 5A and 5B are diagrams showing the method of producing the solid-state pickup devices of Example 1.

Subsequently, in the configuration shown in FIG. 4C, an insulating film serving as an insulating film 334 and an insulating film serving as an insulating film 335 are formed in this order. Here, the insulating film serving as the insulating film 334 is made of silicon oxynitride and is formed by plasma CVD, and the insulating film serving as the insulating film 335 is made of silicon nitride and is formed by plasma CVD. A lens-shaped photoresist pattern is formed on the insulating film serving as the insulating film 335, and the shape of the pattern is transferred to the insulating film by etching using the photoresist pattern as a mask. Then, an insulating film serving as an insulating film 336 is formed on the lens-shaped insulating film. A configuration composed of the insulating films 334 to 336 is obtained by removing the three layers of the insulating films in the region corresponding to an external electrode pad. As a result, a configuration shown in FIG. 5A is obtained. Here, the insulating film 335 is a lens layer having an intralayer lens 337, and the insulating film 334 and the insulating film 336 can function as antireflective films for the insulating film 335.

Figure 5B:
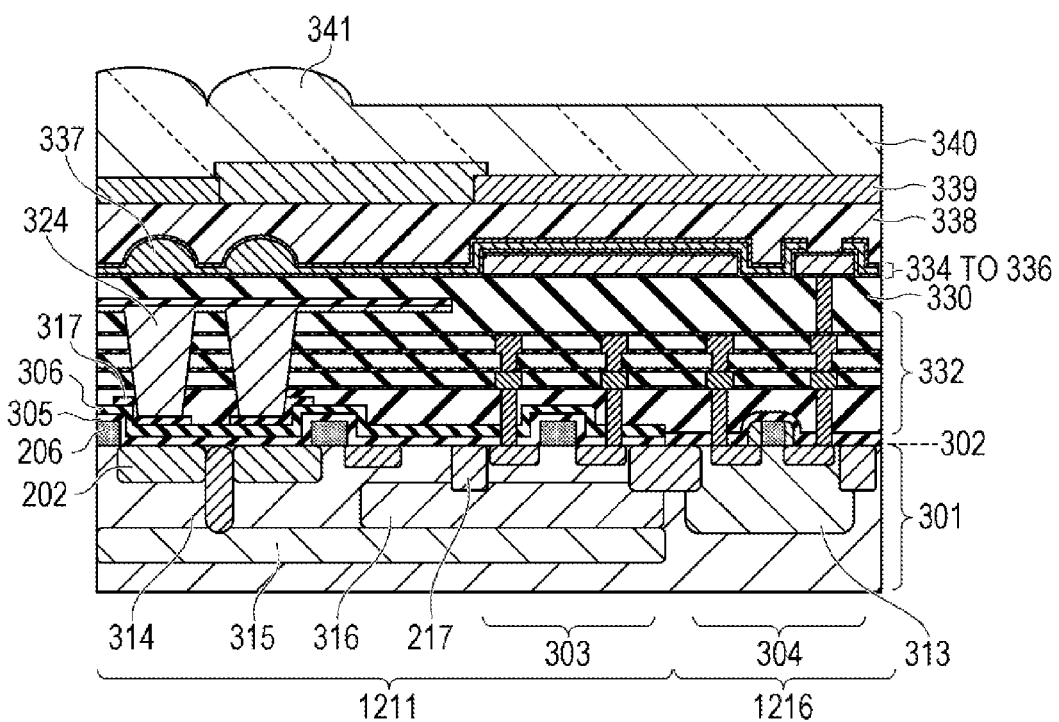

After the step shown in FIG. 5A, a planarizing layer 338 made of a resin, a color filter layer 339 including color filters corresponding to a plurality of colors, and a microlens layer 340 including a microlens 341 are formed in this order to obtain a configuration shown in FIG. 5B.

As described above, according to the flow shown in FIGS. 3A to 3C, 4A to 4C, 5A, and 5B, a solid-state pickup device can be formed. Note that in FIGS. 3A to 3C, 4A to 4C, 5A, and 5B show a part of the semiconductor substrate 301 on the main surface side.

In this embodiment, the above-described method of producing a solid-state pickup device is characterized by the step for forming an opening (depression) by removing interlayer insulating films 319, shown in FIG. 4A. This step will be described in detail with reference to FIGS. 6A to 6D, 7, and 8.

Figure 7:
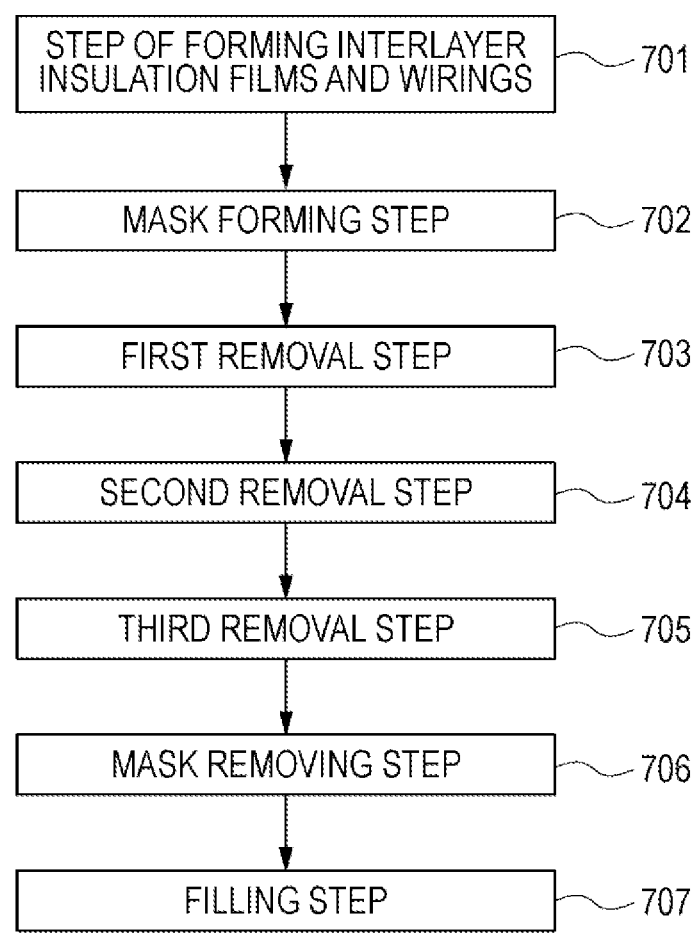
FIG. 7 is a flow chart of the method of producing the solid-state pickup device of Example 1.

FIGS. 6A to 6D are schematic cross-sectional views illustrating in detail the steps shown in FIGS. 3C and 4A and show the portion corresponding to the second PD in an enlarged form. FIG. 7 is a flow chart showing the method so as to correspond to FIGS. 6A to 6D. The descriptions of configurations designated with the same reference numerals as those in other drawings are omitted.

The configuration shown in FIG. 6A is obtained by a step 701 of forming wirings and interlayer insulating films and a mask forming step 702 in FIG. 7. In FIG. 6A, the interlayer insulating films 319 have a configuration in which at least two types of insulating films made of different materials are alternately stacked. Specifically, the interlayer insulating films 319 have a configuration in which at least a member to be formed into a first insulating film, a member to be formed into a second insulating film made of a material different from that of the first insulating film, a member to be formed into a third insulating film made of a material different from that of the member to be formed into the second insulating film, and a member to be formed into a fourth insulating film made of a material different from that of the third insulating film are stacked in this order. In FIG. 6A, insulating films 601, 603, 605, 607, and 609 made of silicon oxide and insulating films 602, 604, 606, and 608 made of silicon nitride are alternately stacked to form the configuration. The member to be formed into the first insulating film is the insulating film 601, the member to be formed into the second insulating film is the insulating film 602, the member to be formed into the third insulating film is the insulating film 603, and the member to be formed into the fourth insulating film is the insulating film 604. Here, wiring layers are not shown, but the insulating film 602 and the insulating film 606 function as etching stop films when wiring layers are formed. The insulating film 608 and the insulating film 604 function as barrier films against the metals serving as electric conductors of the wiring layers. After formation of the interlayer insulating films 319 shown in FIG. 6A, a mask 610 having an opening 611 corresponding to the position of a photoelectric conversion unit is formed on the uppermost layer, that is, the insulating film 609. The mask 610 is made of a photoresist and can be formed by photolithography.

Subsequently, a first removal step 703 shown in FIG. 7 is performed. In the first removal step 703, etching is performed under conditions that the etching selection ratio between multiple insulating films made of different materials is small and that the multiple insulating films made of different materials can be etched. That is, etching is performed under conditions that the multiple insulating films are etched at approximately the same etching rate to remove the insulating films together. The first removal step 703 is performed so as to remove the members serving as the fourth insulating film and the third insulating film at regions corresponding to the openings of the mask over the entire region of a wafer until that the member to be formed into the second insulating film is exposed or is partially removed. Specifically, as shown in FIG. 6B, the insulating films 603 to 609 are continuously etched under the same conditions, that is, conditions that the etching selection ratio between insulating films made of silicon oxide and insulating films made of silicon nitride is small. Here, the etching is terminated or switched at the time when the insulating film 602 is exposed in all the openings over the entire region of the wafer, that is, at the time when the opening in the region where the proceeding of the etching is the lowest reaches a depth of the face 613. This timing for terminating the etching can be set by monitoring the emission intensity of plasma for detecting a decrease in emission intensity due to removal of the member to be formed into the third insulating film or by setting the time in advance. The conditions that the selection ratio between the insulating film made of silicon oxide and the insulating film made of silicon nitride is small are, for example, anisotropic plasma etching using a gas mixture of a hydrogen-containing fluorocarbon gas such as $CHF_3$ and a fluorocarbon gas such as $C_4F_8$, oxygen, and an inert gas such as argon. As a result, the insulating films 603 to 609 are respectively formed into insulating films 6031 to 6091 having openings. That is, in this step, at least a fourth insulating film 6041 having openings is formed from the member 604 serving as the fourth insulating film, and a third insulating film 6031 having openings is formed from the member 603 serving as the third insulating film. The openings of the third insulating film 6031 communicate with the corresponding openings of the fourth insulating film 6041 to configure openings 612.

If the etching conditions for each insulating film are changed, the taper angle for forming an opening is changed due to the difference in etching conditions. This may cause irregularities corresponding to the respective insulating films on the side surface of the opening. However, since etching under constant conditions is possible by performing the first removal step, the side surface of the opening can be smooth compared to the case of performing etching while changing the etching conditions for each insulating film. In addition, since it is unnecessary to change the conditions for etching by performing the first removal step, the time necessary for etching can be reduced compared to the case of performing etching while changing the etching conditions for each insulating film.

Figure 8:
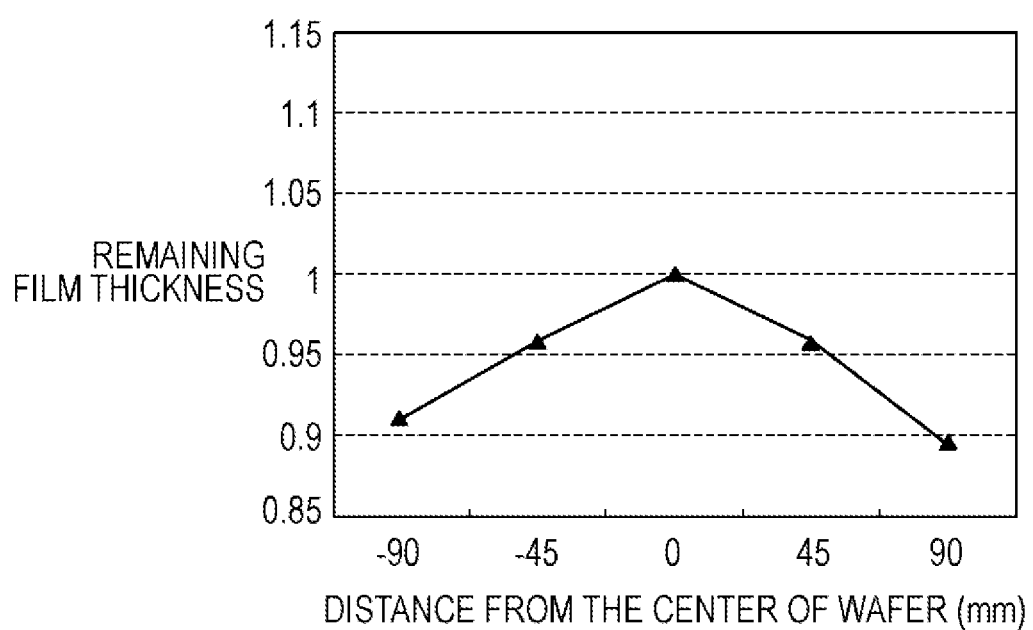
FIG. 8 is a graph describing Example 1.

Here, variation will be described with reference to FIG. 8. In the case of forming a plurality of openings, the face 613, which is also the bottom faces of the openings 612, may have variation in height in-plane of the semiconductor substrate on which the openings are provided. FIG. 8 is a schematic diagram showing in-plane variation in any one-dimensional cross-section of a wafer serving as the semiconductor substrate when etching for removing silicon oxide, which is the main component of the interlayer insulating films, is performed. The horizontal axis shows the distance from the center of the wafer, and the vertical axis shows the thickness of silicon oxide film after etching, provided that the thickness at the center of the wafer is 1. As obvious from FIG. 8, the thickness shows the maximum at the center of the wafer and decreases toward the edge of the wafer. That is, there is global variation. Thus, variation due to etching may be caused in the wafer. The results shown in FIG. 8 reveal that variation due to etching occurs in the range (size) of the solid-state pickup device, which is a part of the wafer. If the etching is continued in such a state, the elements disposed on the semiconductor substrate are damaged. If the variation is kept, a change in light intensity or color shading may occur.

Subsequently, the second removal step 704 shown in FIG. 7 is conducted. In the second removal step 704, etching is performed under conditions that the exposed member to be formed into the second insulating film is preferentially etched than the layer thereunder, i.e., the member to be formed into the first insulating film (conditions that the etching selection ratio is large). That is, the etching is performed under conditions that the etching rate of the second insulating film is higher than the etching rate of the first insulating film. For example, anisotropic plasma etching using a hydrogen-containing fluorocarbon gas such as $CH_2F_2$, oxygen, and an inert gas such as argon is performed. As shown in FIG. 6C, the insulating film 602 is removed at a portion corresponding to the opening 611 of the mask 610 and is formed into an insulating film 6021 having an opening. Here, the insulating film 601 can function as an etching stop film in removal of the insulating film 602. Here, the bottom face of the opening 614 lies at the height of the face 615, i.e., the upper surface of the insulating film 601. In this second removal step 704, the member to be formed into the first insulating film reduces the progress of etching and can inhibit the photoelectric conversion unit from being damaged. In addition, the global variation over the entire wafer, which occurs in the above-described first removal step, in the case of forming a plurality of openings can be absorbed. In this step, the second insulating film 6021 having openings is formed from the member 602 serving as the second insulating film. The opening of the second insulating film communicates with the opening 612 to configure the opening 614.

Finally, a third removal step 705 shown in FIG. 7 is performed. In the third removal step 705, etching is performed under conditions that the exposed member to be formed into the first insulating film is preferentially removed, for example, by plasma etching using a fluorocarbon gas such as $C_4F_6$, oxygen, and an inert gas such as argon. As shown in FIG. 6D, the insulating film 601 is removed at a portion corresponding to the opening 611 of the mask 610 and is formed into an insulating film 6011 having an opening. That is, in this step, a first insulating film 6011 having an opening is formed from the member 601 serving as the first insulating film. The opening of the first insulating film communicates with the opening 614 to form an opening 616. Here, in this embodiment, the insulating film 317 can function as an etching stop film in removal of the insulating film 601. Subsequently, a mask removing step 706 shown in FIG. 7 is performed to remove the mask 610. As a result, interlayer insulating films 3191 having an opening 616, i.e., the opening shown in FIG. 4A, are formed. Subsequently, a filling step 707 shown in FIG. 7 is performed as in the step shown in FIG. 4B.

The method including the above-described first and second removal steps can form an opening (depression) with high precision in the side face of the opening and in-plane of the wafer. In particular, in the case of forming a plurality of openings on a wafer, it is possible to inhibit a film that should be removed from remaining or a film that should not be removed from being removed. In particular, the method is effective in the case of forming a plurality of openings having a large aspect ratio. Consequently, a waveguide is formed with high precision, which reduces problems such that light is irregularly reflected on the side wall or that light intensity varies depending on the position in a wafer where waveguides are formed.

In the second removal step, the first insulating film can absorb damage due to etching for absorbing variation, resulting in a reduction in noise in the resulting photoelectric conversion unit. Furthermore, the removal of the first insulating film allows incident light to more efficiently enter the photoelectric conversion unit in the case of performing the filling step by filling the opening with a nitride film, which has approximately the same refractive index as that of the insulating film 317. The arrangement of the insulating film 317 can further reduce damage to the photoelectric conversion unit in etching. In this embodiment, steps for the case of the first and the third insulating films made of silicon oxide and the second and the fourth insulating films made of silicon nitride have been described. However, any configuration in which a first insulating film, a second insulating film made of a material different from that of the first insulating film, a third insulating film made of a material different from that of the member to be formed into the second insulating film, and a fourth insulating film made of a material different from that of the third insulating film are stacked in this order is included in the present invention. The material of the second insulation film may be the same as material of the third insulation film.

Figure 13:
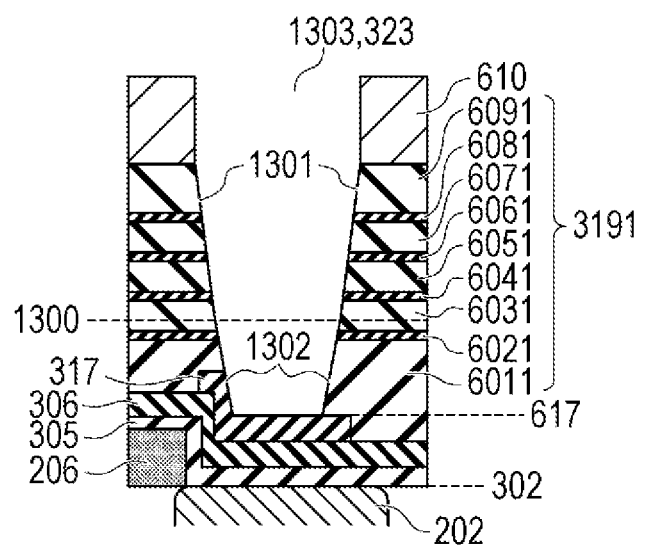
FIG. 13 is a cross-sectional view showing a modification example of the solid-state pickup device of Example 1.

Since the conditions for etching in the first removal step is switched to the conditions for etching in the second removal step, there is a possibility that the inclination of the side face of the opening varies at the switching point to the second removal step. Specifically, as shown in FIG. 13 showing a modification example of FIG. 6D, there is a possibility that the inclination of side face varies at the height 1300 in the opening 1303 having a side face 1301 and a side face 1302. However, since the waveguide lies under the opening, the variation in the inclination does not highly affect the waveguide and does not cause stray light.

Example 2

Figure 9A:
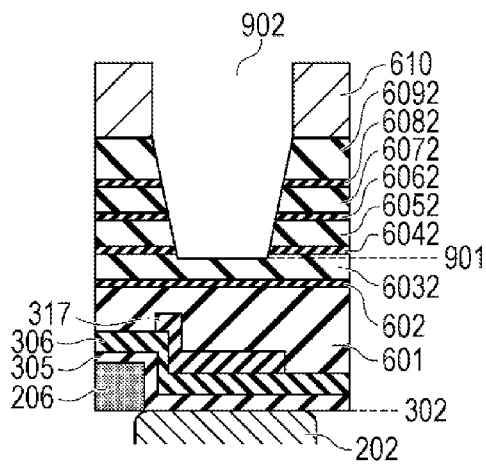
FIGS. 9A to 9D are diagrams showing details of a method of producing a solid-state pickup device of Example 2.
Figure 9B:
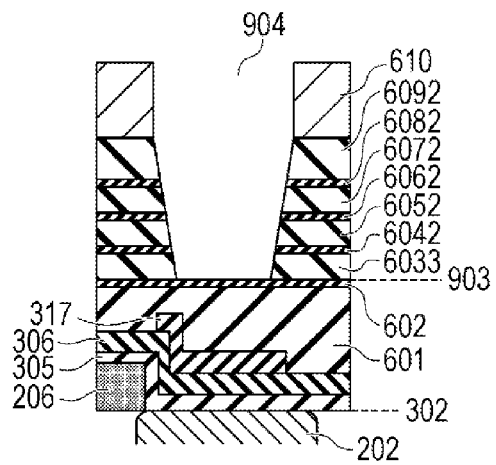
Figure 9C:
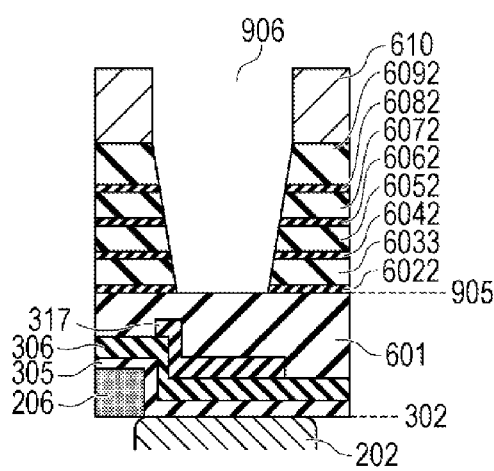
Figure 9D:
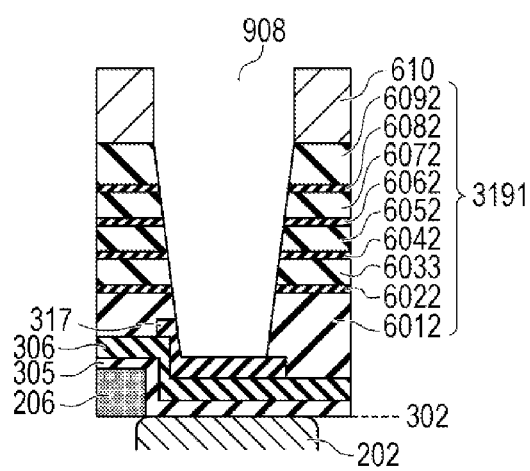

The method of producing a solid-state pickup device of this example will be described with reference to FIGS. 9A to 9D. FIGS. 9A to 9D correspond to FIGS. 6A to 6D showing Example 1. The same configurations as those in the above descriptions are designated with the same reference numerals, and descriptions thereof are omitted. FIGS. 9A, 9B, and 9C correspond to FIGS. 6B, 6C, and 6D, respectively. That is, this example is different from Example 1 in that a removal step shown in FIG. 9D is further performed after the third removal step in Example 1 and that first to fourth insulating films in this example differ from the corresponding insulating films in Example 1.

In also this Example, the interlayer insulating films 3191 have a configuration in which at least two types of insulating films made of different materials are alternately stacked. Specifically, at least a member to be formed into a first insulating film, a member to be formed into a second insulating film made of a material different from that of the first insulating film, a member to be formed into a third insulating film made of a material different from that of the member to be formed into the second insulating film, and a member to be formed into a fourth insulating film made of a material different from that of the third insulating film are stacked in this order. In this Example, the member to be formed into the first insulating film is the same as the insulating film 602 shown in FIG. 6A, and the member to be formed into the second insulating film is the same as the insulating film 603 shown in FIG. 6A. The member to be formed into the third insulating film is the same as the insulating film 604 shown in FIG. 6A, and the member to be formed into the fourth insulating film is the same as the insulating film 605 shown in FIG. 6A. In also this Example, the insulating film 602 and the insulating film 606 function as etching stop films when wiring layers are formed, and the insulating film 608 and the insulating film 604 function as barrier films against the metals serving as electric conductors of the wiring layers.

First, an opening 902 shown in FIG. 9A is formed by performing a first removal step. In the first removal step, the insulating films 604 to 609 are removed at the portion corresponding to an opening of a mask and are formed into insulating films 6042 to 6092 each having an opening. The removal is performed by etching. Here, the etching is performed under conditions that an etching selection ratio between insulating films is small as in Example 1. Here, the insulating film 603 of the member to be formed into the second insulating film is partially removed at a portion corresponding to the opening of the mask and is formed into an insulating film 6032 having a depression on the upper surface. The bottom of the opening, i.e., the upper surface of the insulating film 6032, lies at the height of the face 901. Here, as in Example 1, since the insulating films 604 to 609 are removed by etching under conditions capable of etching these films, global variation is caused in the bottoms of openings with respect to the height of the face 901.

Subsequently, an opening 904 shown in FIG. 9B is formed by performing a second removal step. In the second removal step, the insulating film 6032 is removed at a portion corresponding to the opening of the mask using the insulating film 602 of the member to be formed into the first insulating film as an etching stop film and id formed into an insulating film 6033 having an opening. That is, as in Example 1, etching is performed under conditions that the etching rate of the second insulating film is higher than that of the first insulating film (conditions that the etching selection ratio is high). The bottom face of the opening 904 lies at the height of the face 903, i.e., the upper surface of the insulating film 602. In this step, the variation generated in the first removal step is reduced. It is easy to preferentially etch silicon oxide than silicon nitride, that is, to increase the selection ratio. Accordingly, it is easy to absorb variation, compared to the case of Example 1, by using the insulating film 602 as the etching stop film.

Subsequently, an opening 906 shown in FIG. 9C is formed by performing a third removal step. In the third removal step, the insulating film 602 corresponding to the first insulating film is removed at a portion corresponding to the opening of the mask. On this occasion, it is possible to use the insulating film 601 disposed beneath the insulating film 602 as an etching stop film. That is, etching is performed under conditions that the etching rate of the first insulating film is higher than that of the insulating film 601 (conditions that the etching selection ratio is high). The insulating film 602 is formed into an insulating film 6022 having an opening.

Furthermore, an opening 908 shown in FIG. 9D is formed by performing a step of removing the insulating film 601 by etching. As a result, the insulating film 601 is formed into an insulating film 6012 having an opening. Subsequently, a mask removing step is performed to remove the mask 610. As a result, interlayer insulating films 3191 having the opening 908, i.e., the opening 323 shown in FIG. 4A, are formed. Then, as shown in FIG. 4B, a filling step is performed. When the insulating film 601 is removed, the insulating film 317 can be used as an etching stop film. This insulating film 317 prevents changes in thicknesses of the insulating films 305 and 306 during the etching, and therefore the insulating films 305 and 306 during the etching can maintain thicknesses suitable as antireflective films.

As shown in this Example, the first to fourth insulating films are not limited to those corresponding to the example shown in Example 1 and can be arbitrarily selected. Furthermore, additional film may be disposed among the first to fourth insulating films. In such a case, etching in the first removal step is performed under conditions that the selection ratio between the first to fourth insulating films and the additional film is low.

Furthermore, in formation of an opening in the interlayer insulating films having a configuration where a plurality of insulating films are stacked, it is preferable to remove as many as possible number of the insulating films in the first removal step in order to form the opening having a smooth side face. However, it is preferable to switch the first removal step to the second removal step before that a difference occurs in etching progress between a region where etching most slowly proceeds and a region where etching most rapidly proceeds in-plane of the wafer. Accordingly, the etching conditions may appropriately adjust in view of the balance between the precision of the side wall of the opening and the etching rate on the wafer surface.

Example 3

The method of producing a solid-state pickup device of this example will be described with reference to FIGS. 10A to 10D. FIGS. 10A to 10D are schematic cross-sectional views corresponding to FIGS. 6A to 6D and are mainly different from FIGS. 6A to 6D in that the insulating films 305, 306, and 317 shown in FIGS. 6A to 6D are not present and that the side face does not have inclination. FIGS. 10A to 10D show a portion corresponding to a PD in an enlarged form.

Figure 10A:
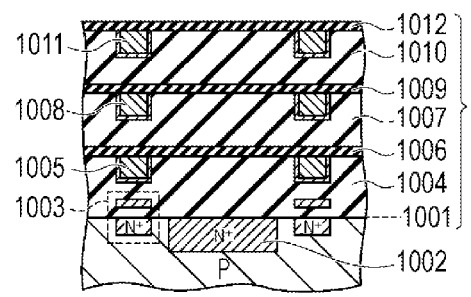
FIGS. 10A to 10D are diagrams showing details of a method of producing a solid-state pickup device of Example 3.

As shown in FIG. 10A, a charge-storage portion 1002 and elements 1003 are disposed on a semiconductor substrate. The elements are not particularly limited and are, for example, transistors and charge-coupled devices. Interlayer insulating films 1013 and first to third wiring layers 1005, 10008, and 1011 are disposed on the main surface 1001 of the semiconductor substrate. Here, contacts and vias are not shown. The interlayer insulating films 1013 have a configuration in which insulating films 1004, 1007, and 1010 made of silicon oxide and insulating films 1006, 1009, and 1012 made of silicon nitride are alternately stacked. In this Example, the insulating films 1006, 1009, and 1012 function as barrier films against the metals serving as electric conductors of wiring layers. The first to third wiring layers 1005, 1008, and 1011 are made of a material of which main component is copper and contain a barrier metal such as tantalum or titanium.

The first wiring layer 1005 is embedded in the insulating film 1004, and the upper surfaces of the first wiring layer 1005 and the insulating film 1004 are correspondent with each other. The insulating film 1006 for preventing diffusion of the material of the first wiring layer 1005 is disposed on the upper surfaces of the first wiring layer 1005 and the insulating film 1004. The second wiring layer 1008 is embedded in the insulating film 1007 disposed on the insulating film 1006, and the upper surfaces of the second wiring layer 1008 and the insulating film 1007 are correspondent with each other. The insulating film 1009 for preventing diffusion of the material of the second wiring layer 1008 is disposed on the upper surfaces of the second wiring layer 1008 and the insulating film 1007. Similarly, the third wiring layer 1011 is embedded in the insulating film 1010 disposed on the insulating film 1009. The upper surfaces of the third wiring layer 1011 and the insulating film 1010 are correspondent with each other, and the insulating film 1012 for preventing diffusion of the material of the third wiring layer 1011 is disposed on the upper surfaces of the third wiring layer 1011 and the insulating film 1010. Here, the insulating film 1004 is used as the first insulating film, the insulating film 1006 is used as the second insulating film, the insulating film 1007 is used as the third insulating film, and the insulating film 1009 is used as the fourth insulating film. Here, the fourth insulating film may be the insulating film 1012, or the third insulating film and the fourth insulating film may be the insulating film 1010 and the insulating film 1012, respectively.

Figure 10B:
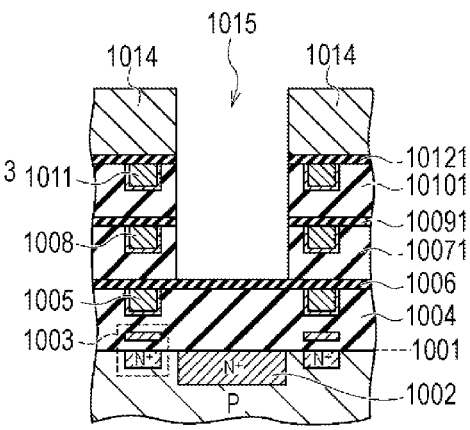

As shown in FIG. 10B, a mask 1014 having an opening so as to correspond to the position of a photoelectric conversion unit is formed on the insulating film 1012, which is the uppermost layer of the interlayer insulating films 1013 of which configuration is shown in FIG. 10A. The mask 1014 is made of a photoresist and can be formed by photolithography. Subsequently, the interlayer insulating films 1013 are continuously etched under conditions that the insulating films are removed together (first removal step). The insulating films 1007, 1009, 1010, and 1012 are removed at a portion corresponding to the opening of the mask by etching and are respectively formed into the insulating films 10071, 10091, 10101, and 10121 to form an opening 1015. Here, the continuous etching is stopped at the time when the insulating film 1006 is exposed at the region where etching most slowly proceeds. That is, this step can be performed as in the first removal step in Example 1. Here, the etching is dry etching such as plasma etching.

Figure 10C:
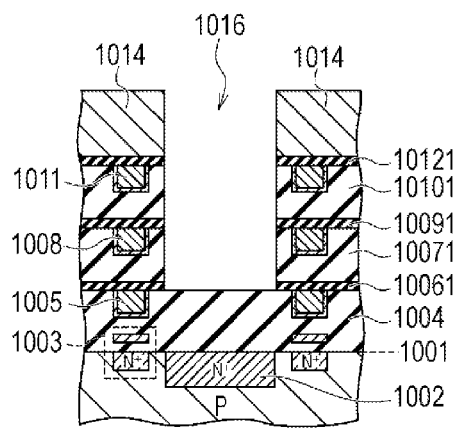
Figure 10D:
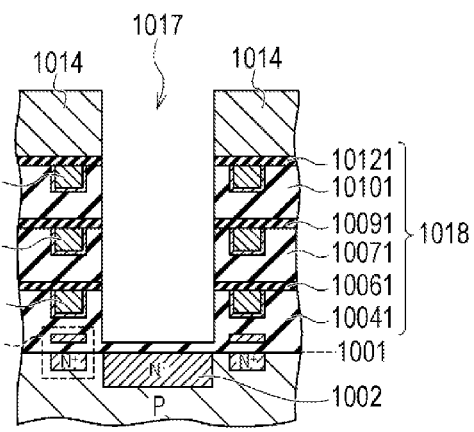

Subsequently, as shown in FIG. 10C, the insulating film 1006 is etched using the insulating film 1004 as an etching stop film. The insulating film 1006 is removed at a portion corresponding to the opening of the mask by etching and is thereby formed into an insulating film 10061 to form an opening 1016. That is, this process is performed as in the second removal step of Example 1.

Finally, the insulating film 1004 is removed by etching. By this etching, the insulating film 1004 is removed at a portion corresponding to the opening of the mask and is thereby formed into an insulating film 10041 to form an opening 1017 in the interlayer insulating films 1018. The opening 1017 is disposed on the main surface 1001 of the semiconductor substrate. Then, the mask 1014 is removed, and a filling step is performed as shown in FIG. 4B.

According to this method, damages due to etching can be reduced, while inhibiting variation in shape of the side wall formed by etching and reducing variation in etching amount.

Example 4

The method of producing a solid-state pickup device of this example will be described with reference to FIGS. 11A to 11D. FIGS. 11A to 11D are schematic cross-sectional views illustrating the method as in FIGS. 10A to 10D. The configuration in this Example is the same as that in Example 3 except that insulating films corresponding to the first to fourth insulating films and the depth of the opening are different from those in Example 3.

Figure 11A:
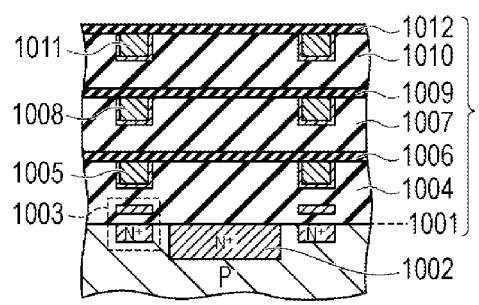
FIGS. 11A to 11D are diagrams showing details of a method of producing a solid-state pickup device of Example 4.

The configuration shown in FIG. 11A is the same as that shown in FIG. 10A. Here, the insulating film 1006 is used as the first insulating film, the insulating film 1007 is used as the second insulating film, the insulating film 1009 is used as the third insulating film, and the insulating film 1010 is used as the fourth insulating film.

Figure 11B:
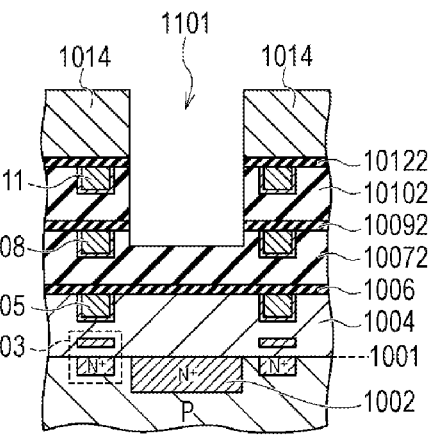

A mask 1014 of a photoresist is formed on the insulating film 1012, which is the uppermost film, and interlayer insulating films are removed (first removal step). In the removal, etching is continuously performed under conditions that the interlayer insulating films are removed under conditions that the insulating films are removed together, and the etching is stopped at a desired time set in advance. That is, this step can be performed as in the first removal step in Example 1. Here, as shown in FIG. 11B, the insulating films 1009, 1010, and 1012 are removed at a portion corresponding to the opening of the mask 1014 and are respectively formed into the insulating films 10092, 10102, and 10122 to form an opening 1101. Here, the insulating film 1007 is partially removed at a portion corresponding to the opening of the mask 1014 in the entire region of the wafer, that is, the insulating film 1007 is removed partially in the thickness direction and is formed into the insulating film 10072.

Figure 11C:
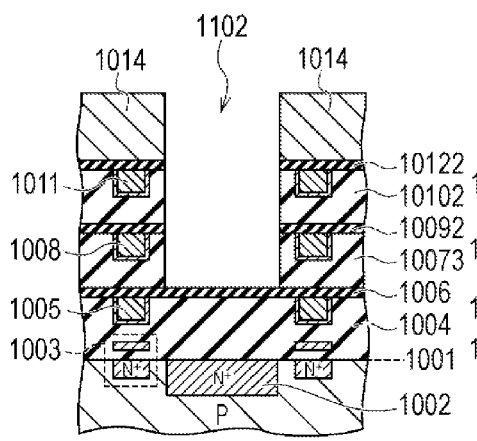
Figure 11D:
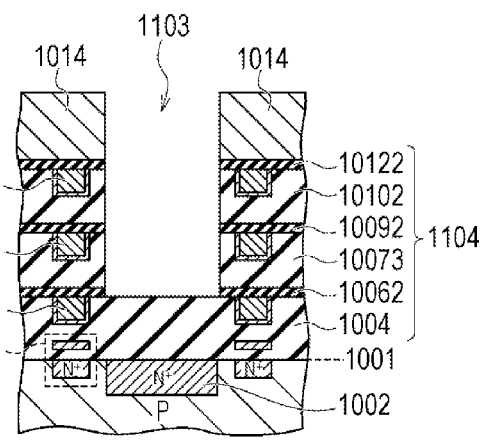

Subsequently, as shown in FIG. 11C, the insulating film 10072 is etched using the insulating film 1006 as an etching stop film. That is, this step can be performed as in the second removal step in Example 1. The remaining insulating film 10072 at the portion corresponding to the opening of the mask is removed by etching and is formed into the insulating film 10073 to form an opening 1102.

Finally, the insulating film 1006 is removed by etching. Here, the insulating film 1004 functions as an etching stop film. That is, the etching is performed under conditions that the etching rate of the insulating film 1006 is higher than that of the insulating film 1004. The insulating film 1006 is removed at a portion corresponding to the opening of the mask by the etching and is formed into the insulating film 10062 to form the opening 1103 in the interlayer insulating films 1104. The insulating film 1004 is exposed in the opening 1103. Then, the mask 1014 is removed, and a filling step is performed as shown in FIG. 4B.

According to this method, damages due to etching can be reduced, while inhibiting variation in shape of the side wall formed by etching and reducing variation in etching amount. In addition, it is possible to inhibit a film that should be removed from remaining or a film that should not be removed from being removed. The presence of the insulating film 1004 can further reduce variation in etching amount.

Example 5

In this Example, a configuration of an image pickup system will be described with reference to FIG. 12. FIG. 12 is a block diagram illustrating a solid-state pickup device and an image pickup system. The image pickup system 1200 includes a solid-state pickup device 1201 and a signal-processing device 1202 that processes an electrical signal input from the solid-state pickup device 1201. Specifically, electrical signals are output from the OUT1 and the OUT2 of the solid-state pickup device 1201 and are input into the IN of the signal-processing device 1202. The OUT3 of the signal-processing device 1202 outputs an image signal, a driving signal, or a control signal depending on the results of processing of the electrical signal. The electrical signal may be a current signal, a voltage signal, an analog signal, or a digital signal. The image pickup system will be described in more detail below. In the case of using the solid-state pickup device 1201 as an image sensor, the signal-processing device 1202 processes input electrical signals and outputs them as image signals. In the case of using the solid-state pickup device 1201 as a focus-detecting sensor, the signal-processing device 1202 processes input electrical signals and outputs them as driving signals for driving a lens (not shown) disposed in front of the solid-state pickup device 1201. In the case of using the solid-state pickup device 1201 as a light-metering sensor, the signal-processing device 1202 processes input electrical signals and outputs them as control signals for controlling a shutter and adjusting exposure time. The shutter may be a mechanical shutter or an electrically-driven shutter. In the case of an electrically-driven shutter, the solid-state pickup device 1201 is substantially controlled. In such an image pickup system, appropriate image signals or control signals applicable to controlling can be obtained.

According to the method of producing a solid-state pickup device of the present invention that has been described using Examples, it is possible to form openings (apertures or depressions) with high precision in the side face of the opening and in-plane of the wafer. Furthermore, it is possible to inhibit a film that should be removed from remaining or a film that should not be removed from being removed. In addition, the presence of the insulating film 1004 can further reduce variation in etching amount. In the second removal step, the first insulating film can absorb damage due to etching for absorbing variation, resulting in a reduction in noise in the resulting photoelectric conversion unit.

Examples can be appropriately modified or combined. For example, silicon nitride may be replaced by silicon carbide, or an organic insulating film may be disposed among the first to fourth insulating films. The laminate of films of silicon oxide and silicon nitride may be replaced by another appropriate film.

In each Example, a solid-state pickup device having a waveguide has been described as an example according to the present invention, but the present invention can be applied to form through-hole electrodes, in addition to waveguides, and can be applied to another semiconductor device such as a memory.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-026348 filed Feb. 9, 2011, which is hereby incorporated by reference herein in its entirety.

What is claimed is:

1. A method of producing a semiconductor device having a semiconductor substrate and multiple insulating films including a first insulating film disposed on the semiconductor substrate, a second insulating film disposed on the first insulating film, a third insulating film disposed on the second insulating film, and a fourth insulating film disposed on the third insulating film and having an opening communicating among at least the second insulating film, the third insulating film, and the fourth insulating film, the method comprising:
    forming a mask having an opening, for forming an opening in the multiple insulating films, above the semiconductor substrate on which a member to be formed into the first insulating film, a member to be formed into the second insulating film made of a material different from that of the member to be formed into the first insulating film, a member to be formed into the third insulating film, and a member to be formed into the fourth insulating film made of a material different from that of the member to be formed into the third insulating film are stacked in this order;
    continuously removing the member to be formed into the fourth insulating film at a portion corresponding to the opening of the mask and the member to be formed into the third insulating film at a portion corresponding to the opening of the mask by etching the member to be formed into the fourth insulating film and the member to be formed into the third insulating film using the mask under conditions that both the member to be formed into the fourth insulating film and the member to be formed into the third insulating film are etched;
    removing the member to be formed into the second insulating film, after the continuous removing, at a portion corresponding to the opening of the mask by etching the member to be formed into the second insulating film using the mask under conditions that the etching rate of the member to be formed into the second insulating film is higher than that of the member to be formed into the first insulating film; and
    removing the member to be formed into first insulating film at a portion corresponding to the opening of the mask by etching using the mask.

2. The method of producing a semiconductor device according to claim 1, wherein
    the third insulating film is made of the same material as the first insulating film; and
    the fourth insulating film is made of the same material as the second insulating film.

3. The method of producing a semiconductor device according to claim 1, wherein
    the first insulating film is made of silicon oxide; and
    the second insulating film is made of silicon nitride.

4. The method of producing a semiconductor device according to claim 1, the method further comprising:
  forming a plurality of photoelectric conversion units in the semiconductor substrate; and
  forming a plurality of insulating films in such a manner that one insulating film corresponds to one photoelectric conversion unit, before forming the multiple insulating films.

5. The method of producing a semiconductor device according to claim 1, the method further comprising:
  forming a wiring layer, during forming the multiple insulating films.

6. The method of producing a semiconductor device according to claim 5, wherein
  the wiring layer includes at least a first wiring layer and a second wiring layer;
  the second insulating film is formed so as to be in contact with the upper surface of the first wiring layer; and
  the fourth insulating film is formed so as to be in contact with the upper surface of the second wiring layer.

7. The method of producing a semiconductor device according to claim 6, wherein
  the first wiring layer and the second wiring layer are formed by a damascene process; and
  the second insulating film and the fourth insulating film function as etching stop films when a groove is formed in the damascene process.

8. A method of producing a solid-state pickup device having a semiconductor substrate provided with a plurality of photoelectric conversion units; multiple insulating films including a first insulating film disposed on the semiconductor substrate, a second insulating film disposed on the first insulating film, a third insulating film disposed on the second insulating film, and a fourth insulating film disposed on the third insulating film and having openings each communicating among at least the second insulating film, the third insulating film, and the fourth insulating film; a high refractive index member disposed in each of the openings so as to correspond to the plurality of photoelectric conversion units; and an insulating film disposed between the high refractive index member and each of the photoelectric conversion units, the method comprising:
  forming a mask having openings, for forming openings in the multiple insulating films, above the semiconductor substrate on which a member to be formed into the insulating film disposed between the high refractive index member and the photoelectric conversion units, a member to be formed into the first insulating film, a member to be formed into the second insulating film made of a material different from that of the member to be formed into the first insulating film, a member to be formed into the third insulating film, and a member to be formed into the fourth insulating film made of a material different from that of the member to be formed into the third insulating film are stacked in this order;
  removing the member to be formed into the fourth insulating film at portions corresponding to the openings of the mask and the member to be formed into the third insulating film at portions corresponding to the openings of the mask by etching the member to be formed into the fourth insulating film and the member to be formed into the third insulating film using the mask under conditions that both the member to be formed into the fourth insulating film and the member to be formed into the third insulating film are etched;
  removing the member to be formed into the second insulating film at portions corresponding to the openings of the mask, after the removing of the member to be formed into the fourth insulating film and the member to be formed into the third insulating film, by etching the member to be formed into the second insulating film using the mask under conditions that the etching rate of the member to be formed into the second insulating film is higher than that of the member to be formed into the first insulating film; and
  removing the member to be formed into the first insulating film at portions corresponding to the openings of the mask by etching the member to be formed into the first insulating film using the mask under conditions that the etching rate of the member to be formed into the first insulating film is higher than that of the member to be formed into the insulating film disposed between the high refractive index member and the photoelectric conversion units.

* * * * *